US012635467B2

(12) United States Patent
Usami et al.

(10) Patent No.: US 12,635,467 B2
(45) Date of Patent: May 19, 2026

(54) MEMBER FOR SEMICONDUCTOR MANUFACTURING APPARATUS

(71) Applicant: NGK INSULATORS, LTD., Nagoya-City (JP)

(72) Inventors: Taro Usami, Ginan-town (JP); Tatsuya Kuno, Nagoya-City (JP)

(73) Assignee: NGK INSULATORS, LTD., Nagoya (JP)

( * ) Notice: Subject to any disclaimer, the term of this patent is extended or adjusted under 35 U.S.C. 154(b) by 225 days.

(21) Appl. No.: 18/638,984

(22) Filed: Apr. 18, 2024

(65) Prior Publication Data

US 2025/0132184 A1     Apr. 24, 2025

Related U.S. Application Data

(63) Continuation of application No. PCT/JP2023/038375, filed on Oct. 24, 2023.

(51) Int. Cl.
*H01L 21/683* (2006.01)
*H01J 37/32* (2006.01)

(52) U.S. Cl.
CPC .... *H01L 21/6833* (2013.01); *H01J 37/32715* (2013.01); *H01J 2237/2007* (2013.01)

(58) Field of Classification Search
CPC ........ H01J 37/32715; H01J 2237/2007; H01L 21/67103; H01L 21/67109; H01L 21/6831; H01L 21/6833; H01L 21/68757; H01L 21/68785
USPC ........................................................ 361/234
See application file for complete search history.

(56) References Cited

U.S. PATENT DOCUMENTS

2023/0197502 A1     6/2023   Inoue et al.

FOREIGN PATENT DOCUMENTS

| JP | 2003059789 A | * | 2/2003 |
| JP | 3447495 B2 | * | 9/2003 |
| JP | 3182120 U | * | 3/2013 |
| JP | 2015207765 A | * | 11/2015 |
| JP | 2016143795 A | * | 8/2016 |

(Continued)

OTHER PUBLICATIONS

Machine translation of Ishimura Japanese Patent Document JP 2015207765 A Nov. 2015 (Year: 2015).*

(Continued)

*Primary Examiner* — Kevin J Comber
(74) *Attorney, Agent, or Firm* — BURR PATENT LAW, PLLC

(57)           ABSTRACT

A member for semiconductor manufacturing apparatus includes a ceramic plate having a wafer placement surface on an upper surface and a built-in electrode; a base plate provided on a lower surface of the ceramic plate, and configured to include a built-in refrigerant flow path; a base plate through-hole provided between adjacent parts of the refrigerant flow path, and configured to penetrate the base plate in an up-down direction; an insulating tube provided in the base plate through-hole, and fixed; and a ceramic plate hole open to the lower surface of the ceramic plate, and provided to communicate with an inside of the insulating tube, wherein a wall thickness of the insulating tube continuously varies in a circumferential direction of the insulating tube.

5 Claims, 8 Drawing Sheets

(56)            References Cited

FOREIGN PATENT DOCUMENTS

| JP | 2017069339 | A | * | 4/2017 |
| JP | 2023-092822 | A | | 7/2023 |

OTHER PUBLICATIONS

Machine translation of Nagasaki Japanese Patent Document JP 3447495 B2 Sep. 2003 (Year: 2003).*
Machine translation of Kosakai Japanese Patent Document JP 2017069339 A Apr. 2017 (Year: 2017).*
Machine translation of Ito Japanese Patent Document JP 2003059789 A Feb. 2003 (Year: 2003).*
Machine translation of Miwa Japanese Patent Document JP 2016143795 A Aug. 2016 (Year: 2016).*
Machine translation of Shinpei Japanese Patent Document JP 3182120 U Mar. 2013 (Year: 2013).*
International Search Report and Written Opinion (Application No. PCT/JP2023/038375) dated Jan. 16, 2024 (6 pages).

* cited by examiner

MEMBER FOR SEMICONDUCTOR MANUFACTURING APPARATUS

BACKGROUND OF THE INVENTION

1. Field of the Invention

The present invention relates to a member for semiconductor manufacturing apparatus.

2. Description of the Related Art

Conventionally, members for semiconductor manufacturing apparatus have been known which include: a ceramic plate having a wafer placement surface on an upper surface and a built-in electrode; a base plate provided on the lower surface of the ceramic plate; a ceramic plate hole that penetrates the ceramic plate in an up-down direction; a base plate through-hole that penetrates the base plate in an up-down direction; and an insulating tube inserted into the base plate through-hole. In PTL 1, it is pointed out that although it is desirable that the central axis of the insulating tube be aligned with the central axis of the base plate through-hole, as a practical matter, those central axes may not be aligned, and when such a misalignment occurs, the degree of heat removal becomes non-uniform.

CITATION LIST

Patent Literature

PTL 1: JP 3182120 U (Paragraph 0005)

SUMMARY OF THE INVENTION

However, when a base plate through-hole is provided between adjacent parts of a refrigerant flow path in the base plate, there has been a demand that the degree of heat removal in part of the wafer placement surface is designed to be intentionally non-uniform, the part being immediately above the ceramic plate hole.

The present invention has been devised to solve such a problem, and it is a main object to provide a structure suitable for controlling and designing the degree of heat removal in part of the wafer placement surface to be non-uniform, the part being immediately above the ceramic plate hole.

[1] A first member for semiconductor manufacturing apparatus of the present invention includes: a ceramic plate having a wafer placement surface on an upper surface and a built-in electrode; a base plate provided on a lower surface of the ceramic plate, and configured to include a built-in refrigerant flow path; a base plate through-hole provided between adjacent parts of the refrigerant flow path, and configured to penetrate the base plate in an up-down direction; an insulating tube provided in the base plate through-hole, and fixed; and a ceramic plate hole open to the lower surface of the ceramic plate, and provided to communicate with an inside of the insulating tube. A wall thickness of the insulating tube continuously varies in a circumferential direction of the insulating tube.

In the member for semiconductor manufacturing apparatus, the wall thickness of the insulating tube continuously varies in a circumferential direction of the insulating tube. Thus, the thermal resistance from the central axis of the ceramic plate hole to the inner circumferential surface of the base plate through-hole continuously varies in a circumferential direction of the insulating tube. Heat removal in the area where the thermal resistance is low is more favorable than the area where the thermal resistance is high. Therefore, the member for semiconductor manufacturing apparatus is suitable for controlling and designing the degree of heat removal in part of the wafer placement surface to be non-uniform, the part being immediately above the ceramic plate bottomed hole.

In the present description, "upper", "lower" do not represent absolute positional relationship, but represent relative positional relationship. Thus, depending on the orientation of the member for semiconductor manufacturing apparatus, "upper" and "lower" may indicate "lower" and "upper", "left" and "right", or "front" and "back".

[2] In the first member for semiconductor manufacturing apparatus (the member for semiconductor manufacturing apparatus according to [1]) of the present invention, the center of the inner circumferential circle of the insulating tube may be eccentric from the center of the outer circumferential circle of the insulating tube. In this manner, the wall thickness of the insulating tube can be continuously varied in a circumferential direction of the insulating tube relatively easily.

[3] A second member for semiconductor manufacturing apparatus of the present invention includes: a ceramic plate having a wafer placement surface on an upper surface and a built-in electrode; a base plate provided on a lower surface of the ceramic plate, and configured to include a built-in refrigerant flow path; a base plate through-hole provided between adjacent parts of the refrigerant flow path, and configured to penetrate the base plate in an up-down direction; an insulating tube provided in the base plate through-hole, and fixed; a ceramic plate hole open to the lower surface of the ceramic plate, and provided to communicate with an inside of the insulating tube; and an insulating tube inner circumferential surface adhesive layer provided so as not to cover the ceramic plate hole, and configured to bond an inner circumferential surface of the insulating tube and the lower surface of the ceramic plate. The length of the insulating tube inner circumferential surface adhesive layer in a radial direction of the insulating tube varies in a circumferential direction of the insulating tube.

In the member for semiconductor manufacturing apparatus, the length of the insulating tube inner circumferential surface adhesive layer in a radial direction of the insulating tube varies in a circumferential direction of the insulating tube. Thus, the thermal resistance from the central axis of the ceramic plate hole to the inner circumferential surface of the base plate through-hole varies in a circumferential direction of the insulating tube. Heat removal in the area where the thermal resistance is low is more favorable than the area where the thermal resistance is high. Therefore, the member for semiconductor manufacturing apparatus is suitable for controlling and designing the degree of heat removal in part of the wafer placement surface to be non-uniform, the part being immediately above the ceramic plate bottomed hole.

[4] In the second member for semiconductor manufacturing apparatus (the member for semiconductor manufacturing apparatus according to [3]) of the present invention, the wall thickness of the insulating tube may be constant in a circumferential direction of the insulating tube, and the central axis of the insulating tube may be eccentric from the central axis of the ceramic plate hole. In this manner, the length of the insulating tube inner circumferential surface adhesive layer in a radial direction can be varied in a circumferential direction of the insulating tube relatively easily.

[5] In the first and second members for semiconductor manufacturing apparatus (the member for semiconductor manufacturing apparatus according to any one of [1] to [4]) of the present invention, the outer circumferential surface of the insulating tube may be bonded via an insulating tube outer circumferential surface adhesive layer to the inner circumferential surface of the base plate through-hole, and the thickness of the insulating tube outer circumferential surface adhesive layer may vary in a circumferential direction of the insulating tube. In this manner, the thermal resistance from the central axis of the ceramic plate hole to the inner circumferential surface of the base plate through-hole can be varied in a circumferential direction of the insulating tube also by the insulating tube outer circumferential surface adhesive layer.

[6] In the first and second members for semiconductor manufacturing apparatus (the member for semiconductor manufacturing apparatus according to any one of [1] to [5]) of the present invention, the base plate through-hole may be provided between adjacent parts of the refrigerant flow path, and one of the adjacent parts of the refrigerant flow path may have a higher ceiling surface than the other refrigerant flow path. In this case, heat is more likely to be removed by parts of adjacent refrigerant flow path, having a higher ceiling surface, thus the temperature of the wafer placement surface gradually increases from a position opposed to the refrigerant flow path having a higher ceiling surface to a position opposed to the refrigerant flow path having a lower ceiling surface. Thus, it is preferable to design the degree of heat removal in part of the wafer placement surface to correspond to this tendency, the part being immediately above the ceramic plate hole, thus the significance of application of the present invention is high.

For example, when the wall thickness of the insulating tube varies in a circumferential direction of the insulating tube, the wall thickness of the insulating tube may be the largest at the position closest to the refrigerant flow path having a higher ceiling surface, and may gradually decrease as the distance to the refrigerant flow path having a lower ceiling surface decreases, then may be the smallest at the position closest to the refrigerant flow path having a lower ceiling surface. When the length of the insulating tube inner circumferential surface adhesive layer in a radial direction varies in a circumferential direction of the insulating tube, the length may be the largest at the position closest to the refrigerant flow path having a higher ceiling surface, and may gradually increase as the distance to the refrigerant flow path having a lower ceiling surface decreases, then may be the longest at the position closest to the refrigerant flow path having a lower ceiling surface.

[7] In the first and second members for semiconductor manufacturing apparatus (the member for semiconductor manufacturing apparatus according to any one of [1] to [6]) of the present invention, the ceramic plate hole may be a bottomed hole provided from the lower surface of the ceramic plate to the electrode, or a through-hole penetrating the ceramic plate in an up-down direction. In the former case, in the electrode, a power supply member may be electrically connected to the inside and bottomed hole of the insulating tube. In the latter case, the through-hole may be utilized as a gas hole for supplying a heat transfer gas to the lower surface of the wafer, or as a lift pin hole for inserting a lift pin to vertically move the wafer with respect to the wafer placement surface.

DETAILED DESCRIPTION OF THE INVENTION

First Embodiment

Figure 1:
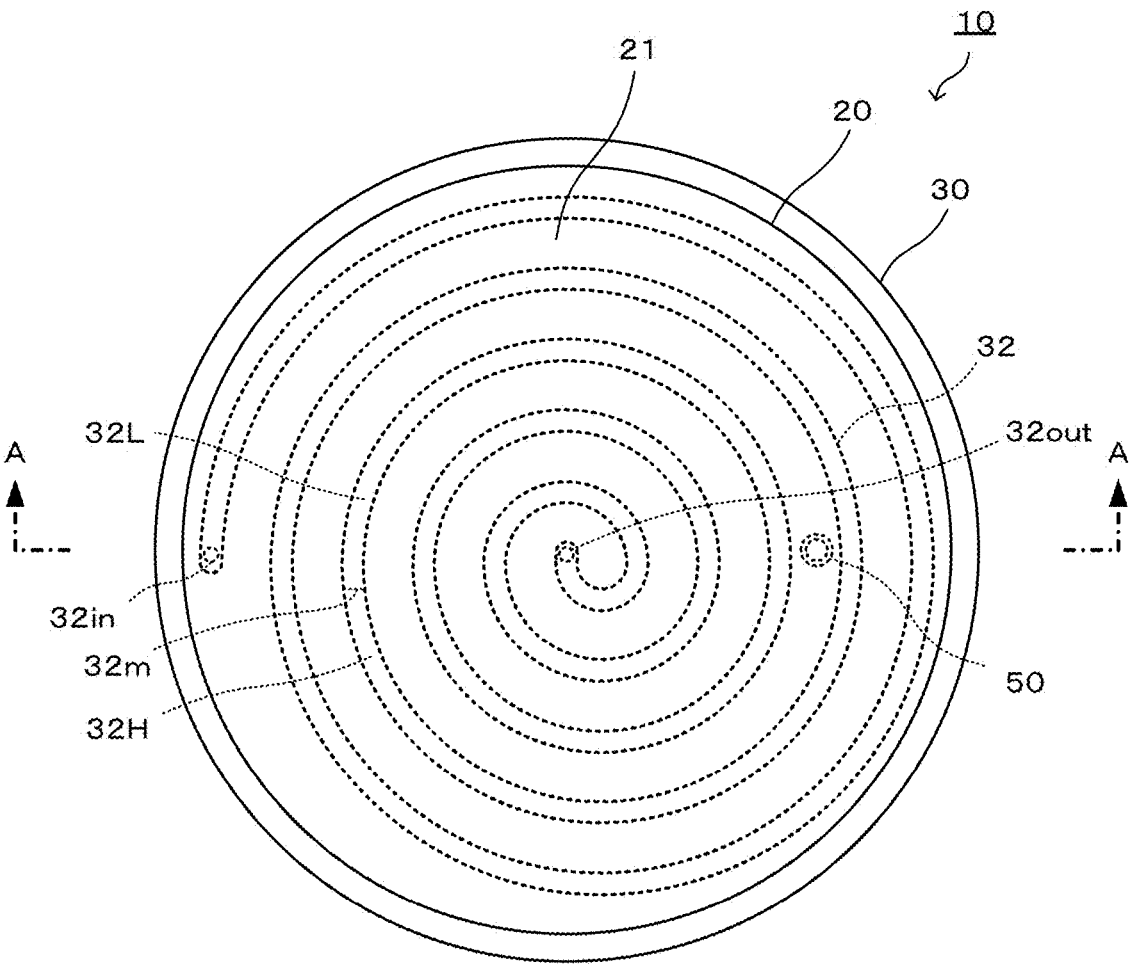
FIG. 1 is a plan view of a wafer placement table 10 which is a first embodiment.
Figure 3:
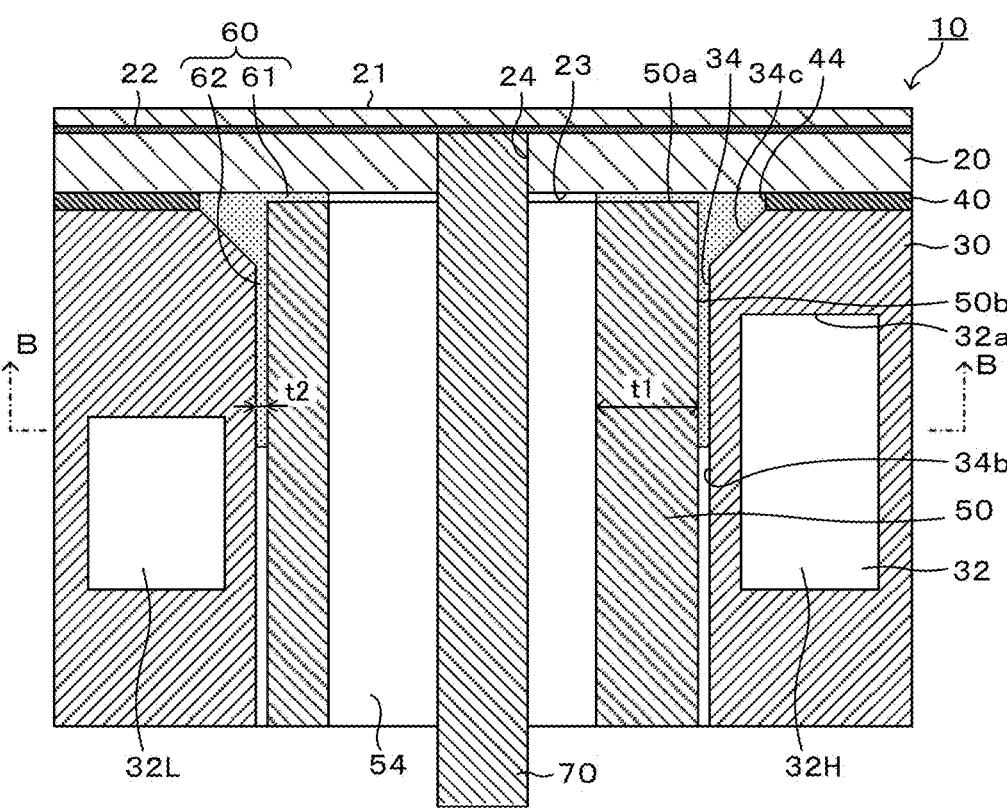
FIG. 3 is a partially enlarged view of FIG. 2.
Figure 4:
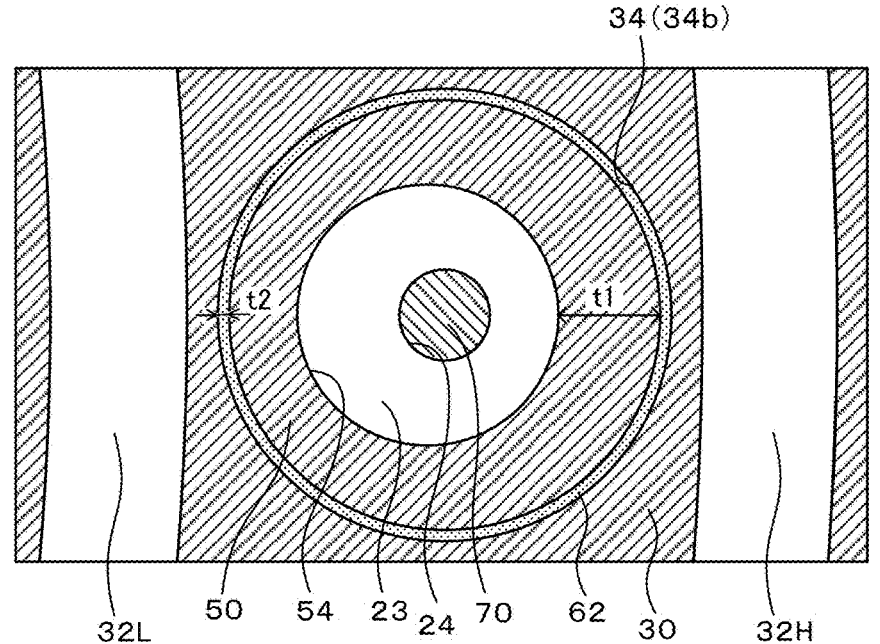
FIG. 4 is a B-B cross-sectional view (partially enlarged horizontal cross-sectional view) of FIG. 3.

A preferred embodiment of the present invention will be described with reference to the drawings. FIG. 1 is a plan view of a wafer placement table 10, FIG. 2 is an A-A cross-sectional view (vertical cross-sectional view) of FIG. 1, FIG. 3 is a partially enlarged view (an enlarged view in the frame indicated by a two-dot chain line) of FIG. 2, and FIG. 4 is a B-B cross-sectional view (partially enlarged horizontal cross-sectional view) of FIG. 3.

Figure 2:
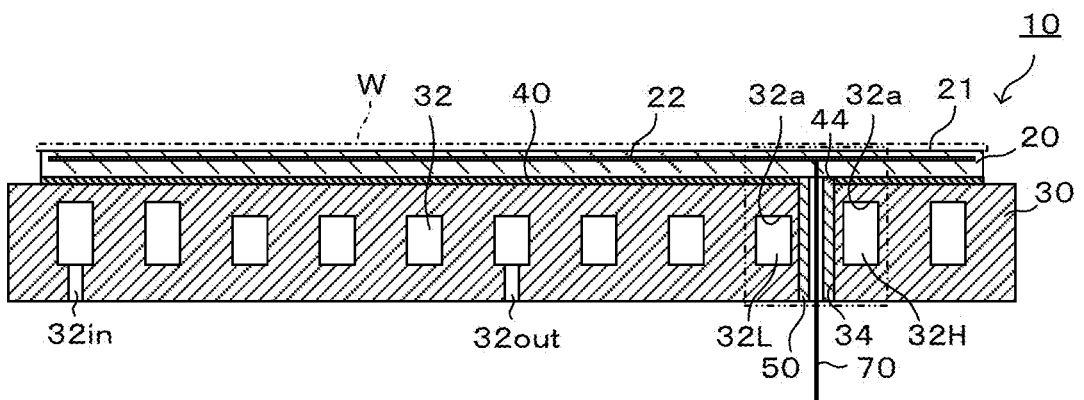
FIG. 2 is an A-A cross-sectional view (vertical cross-sectional view) of FIG. 1.

The wafer placement table 10 is an example of a member for semiconductor manufacturing apparatus of the present invention, and as illustrated in FIG. 2, includes a ceramic plate 20, a base plate 30, a bonding layer 40, a base plate through-hole 34, an insulating tube 50, and a power supply member 70.

The ceramic plate 20 is a ceramic disk (e.g., a diameter of 300 mm, a thickness of 5 mm) such as an alumina sintered body or an aluminum nitride sintered body. The upper surface of the ceramic plate 20 is a wafer placement surface 21 on which wafer W is placed. The ceramic plate 20 has a built-in electrostatic electrode 22. Although illustration is omitted, an annular seal band is formed along the outer edge of the wafer placement surface 21 of the ceramic plate 20, and a plurality of small circular projections are formed on the entire inner surface of the seal band. The electrostatic electrode 22 is a planar mesh electrode, and coupled to an external DC power supply (not illustrated) via a power supply member 70. When a DC voltage is applied to the electrostatic electrode 22, the wafer W is attracted and fixed to the wafer placement surface 21 by an electrostatic attraction force, and when the application of the DC voltage is stopped, the attraction and fixing of the wafer W to the wafer placement surface 21 is released.

The base plate 30 is a circular plate (e.g., a circular plate with a thickness of 25 mm and a diameter equal to or greater than the diameter of the ceramic plate 20) having good electrical conductivity and thermal conductivity. A refrigerant flow path 32, through which a refrigerant is circulated, is formed inside the base plate 30. The refrigerant which flows through the refrigerant flow path 32 is preferably liquid, and preferably has electrical insulating properties. As the liquid having electrical insulating properties, e.g., fluorine-based inert liquid may be mentioned. As illustrated in FIG. 1, the refrigerant flow path 32 is formed in a swirl shape over the entirety of the base plate 30 in a one-stroke pattern in a plan view from one end (inlet 32in) to the other end (outlet 32out). The refrigerant flow path 32 has two flow channels 32H, 32 L having respective ceiling surfaces 32a at different positions. The flow channel 32H is provided in the section (e.g., about two circumferences) from the inlet 32 in to a middle position 32m, and the flow channel 32L is provided in the section from the middle position 32m to the outlet 32out. The ceiling surface 32a in the vicinity of the middle position 32m of the refrigerant flow path 32 may be inclined from the flow channel 32H to the flow channel 32L. The inlet 32 in and the outlet 32out of the refrigerant flow path 32 are respectively coupled to a supply port and a collection port of an external refrigerant device which is not illustrated. The refrigerant supplied from the supply port of the external refrigerant device to the inlet 32 in of the refrigerant flow path 32 passes through the refrigerant flow path 32, then returns from the outlet 32out of the refrigerant flow path 32 to the collection port of the refrigerant flow path 32, undergoes temperature control, and is supplied again from the supply port to the inlet 32 in of the refrigerant flow path 32. The base plate 30 is coupled to a radio-frequency (RF) power supply, and is also used as an RF electrode.

As the material for the base plate 30, e.g., a metal material and a composite material of metal and ceramic may be mentioned. As the metal material, Al, Ti, Mo or an alloy thereof may be mentioned. As the composite material of metal and ceramic, a metal matrix composite material (MMC) and a ceramic matrix composite material (CMC) may be mentioned. As a specific example of such a composite material, a material containing Si, SiC and Ti (also referred to as SiSiCTi), a material obtained by impregnating a Sic porous body with Al and/or Si, and a composite material of $Al_2O_3$ and TiC may be mentioned. As the material for the base plate 30, a material having a coefficient of thermal expansion closer to that of the material for the ceramic plate 20 is preferably selected. When the material for the ceramic plate 20 is alumina, the material for the base plate 30 is preferably pure Ti or α-β Ti alloy. This is because the coefficient of thermal expansion of pure Ti and α-β Ti alloy is close to the coefficient of thermal expansion of alumina. The base plate 30 may be comprised of a material having a thermal conductivity lower than the thermal conductivity of Al, and may be comprised of a material having a thermal conductivity lower than the thermal conductivity of the material (e.g., alumina) for the ceramic plate 20. As those materials, a Ti-containing material represented by e.g., pure Ti and α-β Ti may be mentioned. When the material for the base plate 30 is a Ti-containing material, the present invention is highly effective. The thermal conductivity of the base plate 30 may be 50 W/mK or lower, and may be 5 to 20 W/mk. For example, the thermal conductivity of pure Ti is 17 W/mk, and the thermal conductivity of α-β Ti is 7.5 W/mK. Note that the thermal conductivity of Al is 150 to 200 W/mK.

The bonding layer 40 is a resin adhesive layer herein, and bonds the lower surface of the ceramic plate 20 and the upper surface of the base plate 30 together. As the material for the resin adhesive layer, e.g., an insulating resin such as an epoxy resin, an acrylic resin, and a silicone resin may be mentioned. The bonding layer 40 may be an insulating resin containing a filler. The filler is preferably a material with a thermal conductivity higher than the thermal conductivity of the insulating resin of the bonding layer 40, and may be e.g., alumina or aluminum nitride.

The base plate through-hole 34 is a substantially cylindrical hole that penetrates the base plate 30 in an up-down direction, and is provided between adjacent parts of refrigerant flow path 32. One of the adjacent parts of the refrigerant flow path 32 is the flow channel 32H with the ceiling surface 32a at a higher position, and the other is the flow channel 32L with the ceiling surface 32a at a lower position. The base plate through-hole 34 communicates with a bonding layer through-hole 44. The bonding layer through-hole 44 is a substantially cylindrical hole that penetrates the bonding layer 40 in an up-down direction.

The insulating tube 50 is stored in the base plate through-hole 34 and the bonding layer through-hole 44. The insulating tube 50 is a substantially cylindrical member comprised of an electrically insulating material (for example, the same material as that of the ceramic plate 20), and has an insulating tube through-hole 54 that penetrates the insulating tube 50 in an up-down direction along the central axis of the insulating tube 50. A wall thickness t1 (length in a radial direction) of the insulating tube 50 continuously varies in a circumferential direction of the insulating tube 50. Specifically, the center of the inner circumferential circle (the insulating tube through-hole 54) of the insulating tube 50 is eccentric from the center of the outer circumferential circle of the insulating tube 50, thus the wall thickness t1 of the insulating tube 50 continuously varies. The wall thickness t1 of the insulating tube 50 is the largest at the position closest to the flow channel 32H, and gradually decreases as the distance to the flow channel 32L decreases, then is the smallest at the position closest to the flow channel 32L.

As illustrated in FIG. 3, the insulating tube 50 is bonded to the lower surface 23 of the ceramic plate 20 and the inner circumferential surface 34b of the base plate through-hole 34 via the adhesive layer 60 containing a resin. The upper end of the base plate through-hole 34 is a tapered surface 34c which has a C chamfered shape. The adhesive layer 60 includes: an insulating tube upper surface adhesion part 61 that bonds the lower surface 23 of the ceramic plate 20 and an upper surface 50a of the insulating tube 50 together; and an insulating tube outer circumferential surface adhesion part 62 that is continuous to the insulating tube upper surface adhesion part 61, and bonds the inner circumferential surface 34b of the base plate through-hole 34 and an outer circumferential surface 50b of the insulating tube 50 together. The insulating tube outer circumferential surface adhesion part 62 is provided from the lower surface 23 of the ceramic plate 20 to a position lower than the ceiling surface 32a of the flow channel 32L of the refrigerant flow path 32. A wall thickness t2 (length in a radial direction) of the insulating tube outer circumferential surface adhesion part 62 is constant in a circumferential direction of the insulating tube 50. As the material for the adhesive layer 60, e.g., an insulating resin such as an epoxy resin, an acrylic resin, and a silicone resin may be mentioned. The adhesive layer 60 may be an insulating resin containing a filler. The filler is preferably a material with a thermal conductivity higher than the thermal conductivity of the insulating resin of the adhesive layer 60, and may be e.g., alumina or aluminum nitride. The adhesive layer 60 may have a thermal conductivity higher than the thermal conductivity of the bonding layer 40.

The power supply member 70 is e.g., a metal rod. The metal used for the power supply member 70 is e.g., W, Mo, Ni, and preferably has a coefficient of thermal expansion close to the coefficient of thermal expansion of the ceramic plate 20. As illustrated in FIG. 3, the power supply member 70 is inserted into the insulating tube through-hole 54 and a ceramic plate bottomed hole 24, and electrically connected to the electrostatic electrode 22 exposed to the ceramic plate bottomed hole 24 to supply electric power to the electrostatic electrode 22. The ceramic plate bottomed hole 24 is a substantially cylindrical hole provided from the lower surface 23 of the ceramic plate 20 to the electrostatic electrode 22, and is smaller than the insulating tube through-hole 54 in diameter. The central axis of the ceramic plate bottomed hole 24 is aligned with the central axis of the base plate through-hole 34. The power supply member 70 is electrically insulated from the base plate 30 by the insulating tube 50 disposed in the base plate through-hole 34 and the bonding layer through-hole 44. Note that instead of being comprised of one metal rod, the power supply member 70 may be a flexible metal wire that connects a cylindrical upper metal terminal and a cylindrical lower metal terminal.

Subsequently, the process of bonding the insulating tube 50 in a method of manufacturing the wafer placement table 10 will be described using FIGS. 5A to 5D. FIGS. 5A to 5D are explanatory views of the process. Note that in FIGS. 5A to 5D, the wafer placement surface 21 of the ceramic plate 20 faces down. FIGS. 5A to 5D are partially enlarged views of the surroundings of the base plate through-hole 34.

Figures 5A, 5B, 5C, 5D:
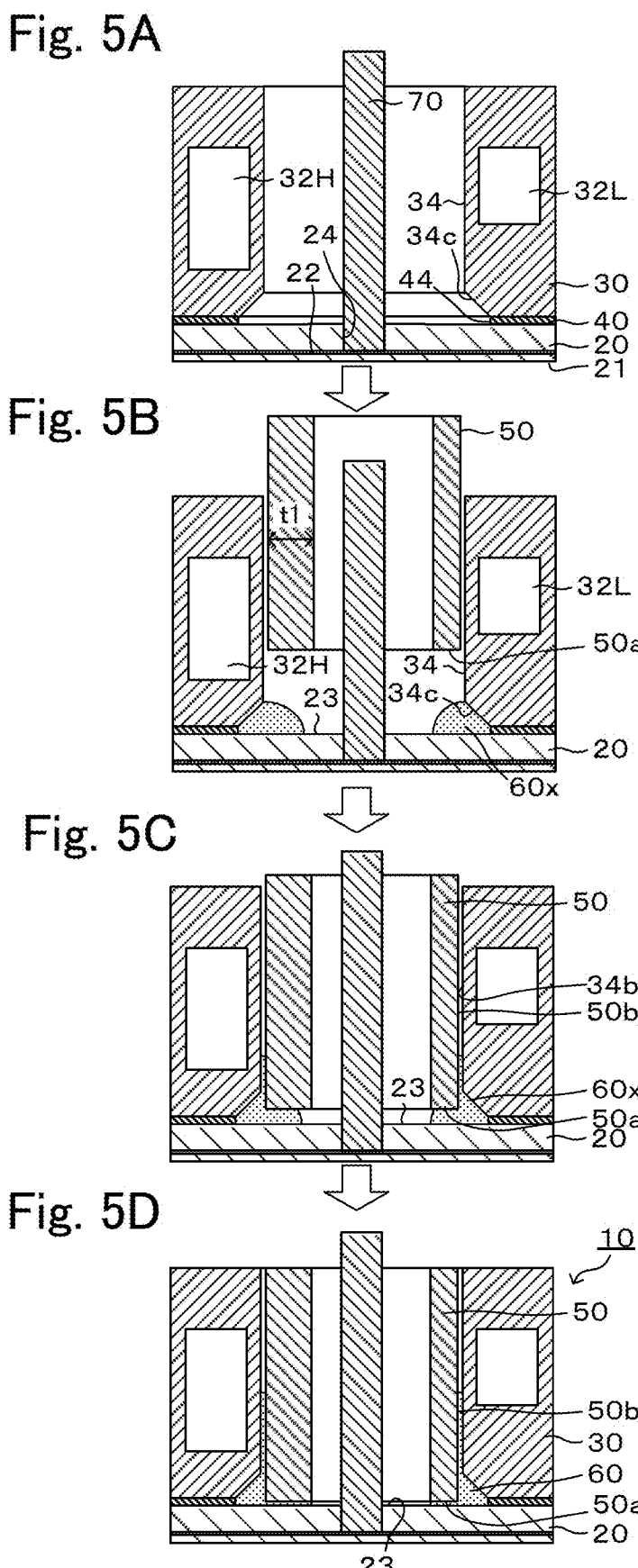
FIGS. 5A to 5D are explanatory views illustrating a bonding process for an insulating tube 50.

First, a bonded body obtained by bonding the ceramic plate 20 and the base plate 30 by the bonding layer 40 is prepared (FIG. 5A). In the bonded body, the electrostatic electrode 22 is embedded in the ceramic plate 20. In the bonded body, the power supply member 70 is inserted into the ceramic plate bottomed hole 24 through the base plate through-hole 34 and the bonding layer through-hole 44, and is electrically connected to the electrostatic electrode 22. The central axis of the power supply member 70 is aligned with the central axes of the base plate through-hole 34, the bonding layer through-hole 44 and the ceramic plate bottomed hole 24.

Next, an adhesive agent 60x is disposed between the tapered surface 34c of the base plate through-hole 34 and the lower surface 23 of the ceramic plate 20, and the insulating tube 50 is inserted so that the upper surface 50a of the insulating tube 50 is opposed to the adhesive agent 60x (FIG. 5B). In this process, the insulating tube 50 is disposed so that the portion of the insulating tube 50 having the greatest wall thickness t1 is located closest to the flow channel 32H, and the portion of the insulating tube 50 having the smallest wall thickness t1 is located closest to the flow channel 32L.

Subsequently, when the insulating tube 50 is inserted toward the ceramic plate 20, the adhesive agent 60x adheres and spreads between the lower surface 23 of the ceramic plate 20 and the upper surface 50a of the insulating tube 50, and between the inner circumferential surface 34b of the base plate through-hole 34 and the outer circumferential surface 50b of the insulating tube 50 (FIG. 5C).

Furthermore, when the insulating tube 50 is inserted toward the ceramic plate 20, the adhesive agent 60x is filled between the lower surface 23 of the ceramic plate 20 and the upper surface 50a of the insulating tube 50, and is raised up between the inner circumferential surface 34b of the base plate through-hole 34 and the outer circumferential surface 50b of the insulating tube 50. When the adhesive agent 60x is hardened in this state, the insulating tube 50 is fixed to the ceramic plate 20 and the base plate 30 via the adhesive layer 60. In this manner, the wafer placement table 10 is obtained (FIG. 5D).

Next, a use example of thus configured wafer placement table 10 will be described. First, in a state where the wafer placement table 10 is installed in a chamber (not illustrated), the wafer W is placed on the wafer placement surface 21. The inside of the chamber is decompressed by a vacuum pump, and adjusted to a predetermined degree of vacuum, and a DC voltage is applied to the electrostatic electrode 22 of the ceramic plate 20 to generate an electrostatic attraction force to cause the wafer W to be attracted and fixed to the wafer placement surface 21. Next, a reactive gas atmosphere having a predetermined pressure (e.g., several 10 to several 100 Pa) is attained in the chamber, and in this state, an RF voltage is applied across an upper electrode (not illustrated) provided in the ceiling portion in the chamber and the base plate 30 of the wafer placement table 10 to generate a plasma. The surface of wafer W is processed by the generated plasma. A refrigerant is circulated through the refrigerant flow path 32 of the base plate 30 as appropriate.

When the wafer W is processed by plasma in this manner, heat input by the plasma is removed by the base plate 30, and the wafer placement surface 21 is controlled to achieve a desired temperature distribution. The flow channel 32H with a higher ceiling surface 32a is provided in the outer circumference side of the wafer placement table 10, and the flow channel 32L with a lower ceiling surface 32a is provided in the inner circumference side. Thus, heat removal by the refrigerant is higher on the outer circumference side of the wafer placement surface 21 than on the inner circumference side thereof. Also, the temperature gradually increases in an area (area immediately above the boundary portion) of the wafer placement surface 21 from the flow channel 32H to the flow channel 32L, the area being opposed to the boundary portion between the adjacent flow channel 32H and flow channel 32L. Since the base plate through-hole 34 is provided in the boundary portion between the adjacent flow channel 32H and flow channel 32L, the area (the area immediately above the holes) of the wafer placement surface 21, immediately above the ceramic plate through-hole 24 and the base plate through-hole 34 is likely to have a temperature distribution different from the temperature distribution in the surroundings.

Figure 6:
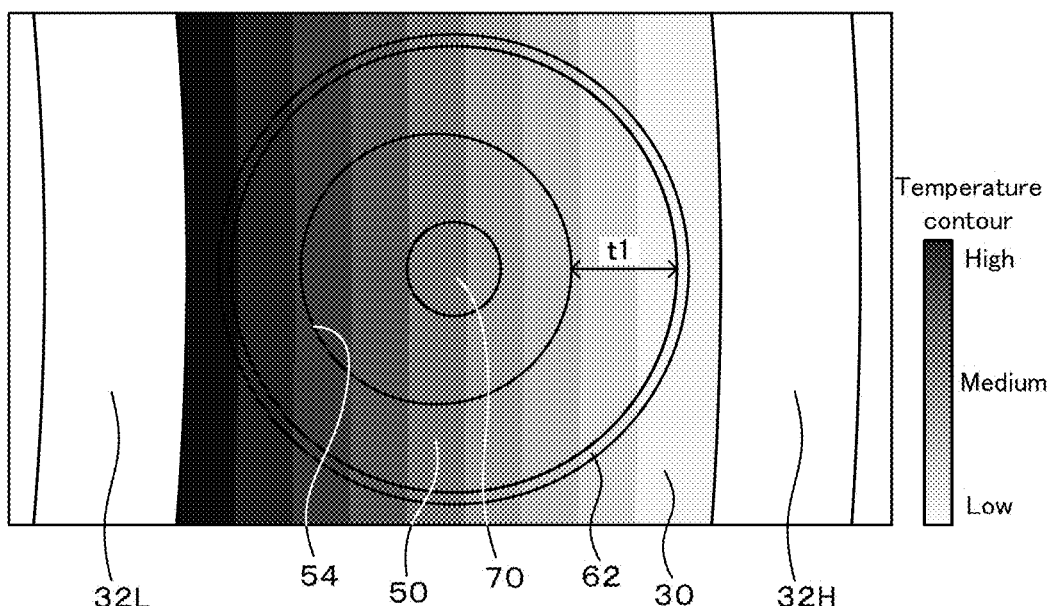
FIG. 6 is a temperature contour image in a first embodiment.

However, in the first embodiment, the wall thickness t1 of the insulating tube 50 continuously varies in a circumferential direction of the insulating tube 50. Thus, the thermal resistance from the central axis of the ceramic plate bottomed hole 24 to the inner circumferential surface of the base plate through-hole 34 continuously varies in a circumferential direction of the insulating tube 50. Heat removal in the area where the thermal resistance is low is more favorable than the area where the thermal resistance is high. The wall thickness t1 of the insulating tube 50 is the largest at the position closest to the flow channel 32H, and gradually decreases as the distance to the flow channel 32L decreases, then is the smallest at the position closest to the flow channel 32L. Therefore, as in the area immediately above the boundary portion, also in the area immediately above the holes of the wafer placement surface 21, the temperature gradually increases from the flow channel 32H to the flow channel 32L. The temperature contour image of the wafer placement surface 21 at this point is illustrated in FIG. 6. In this manner, in the first embodiment, the area immediately above the holes of the wafer placement surface 21 has a substantially similar temperature distribution to the temperature distribution of the area immediately above the boundary portion.

Figure 7:
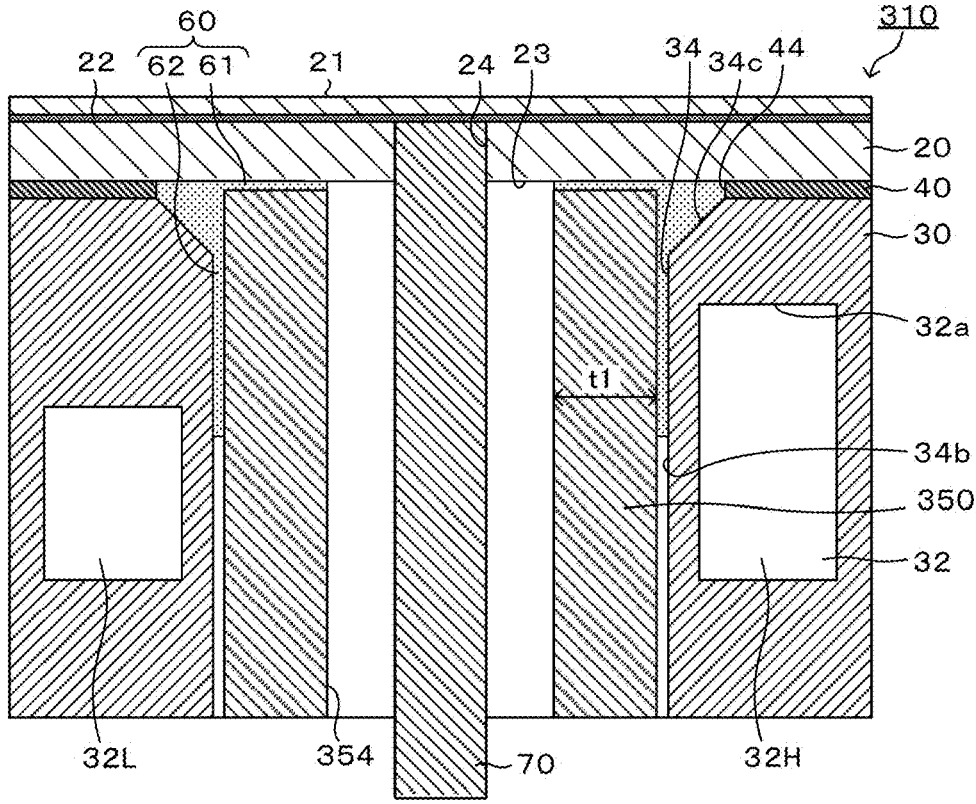
FIG. 7 is a partially enlarged vertical cross-sectional view of a wafer placement table 310 which is a comparative example.
Figure 8:
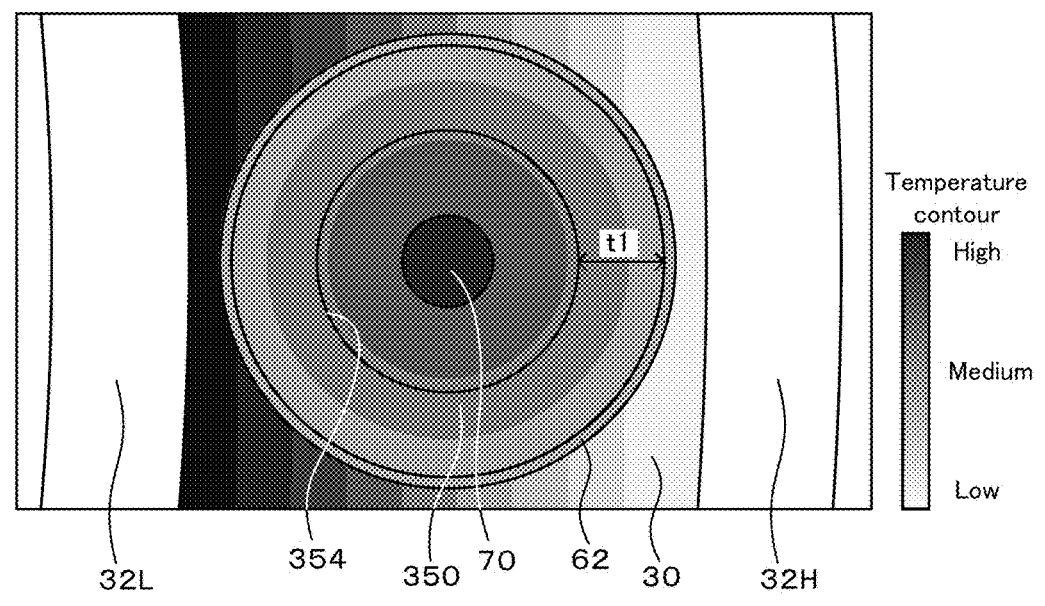
FIG. 8 is a temperature contour image in a comparative example.

Here, as a comparative example, FIG. 7 is illustrated. A wafer placement table 310 in a comparative example is the same as in the above-described embodiment except that an insulating tube 350 is used instead of the insulating tube 50 in the above-described embodiment. In FIG. 7, the same components as in the first embodiment are labeled with the same symbol. The wall thickness t1 of the insulating tube 350 is constant in a circumferential direction of the insulating tube 350. Specifically, the center of the inner circumferential circle (insulating tube through-hole 354) of the insulating tube 350 is aligned with the center of the outer circumferential circle of the insulating tube 350. In this case, the area immediately above the holes of the wafer placement surface 21 shows a temperature distribution in which the temperature is the highest near the center, and gradually decreases toward the surroundings. The temperature contour image of the wafer placement surface 21 at this point is illustrated in FIG. 8. In this manner, in the comparative example, the area immediately above the holes of the wafer placement surface 21 has a temperature distribution different from the temperature distribution of the area immediately above the boundary portion, resulting in a temperature singular area.

In the wafer placement table 10 of the first embodiment described in detail above, the wall thickness t1 of the insulating tube 50 continuously varies in a circumferential direction of the insulating tube 50, which is suitable for controlling and designing the degree of heat removal in part of the wafer placement surface 21 to be non-uniform, the part being immediately above the ceramic plate bottomed hole 24.

In addition, the center of the inner circumferential circle of the insulating tube 50 is eccentric from the center of the outer circumferential circle of the insulating tube 50. Thus, the wall thickness t1 of the insulating tube 50 can be continuously varied in a circumferential direction of the insulating tube 50 relatively easily.

Furthermore, the base plate through-hole 34 is provided between adjacent parts of refrigerant flow path 32 in the base plate 30, and one (the flow channel 32H) of the adjacent parts of refrigerant flow path 32 has a higher ceiling surface 32a than the other (the flow channel 32L). In this case, heat is more likely to be removed from the ceramic plate 20 by the flow channel 32H than by the flow channel 32L, thus the temperature of the wafer placement surface 21 gradually increases from a position opposed to the flow channel 32H to a position opposed to the flow channel 32L. Thus, it is preferable to design the degree of heat removal in part of the wafer placement surface 21 to correspond to this tendency, the part being immediately above the ceramic plate bottomed hole 24, thus the significance of application of the present invention is high.

Second Embodiment

Figure 9:
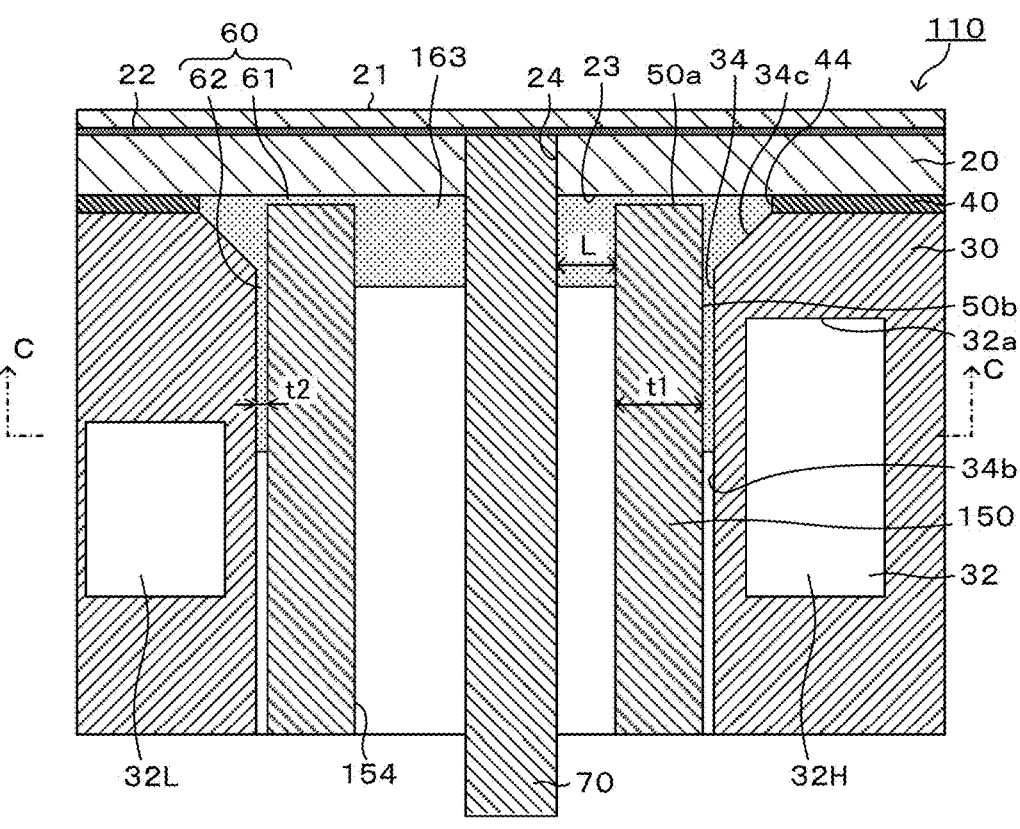
FIG. 9 is a partially enlarged vertical cross-sectional view of a wafer placement table 110 which is a second embodiment.
Figure 10:
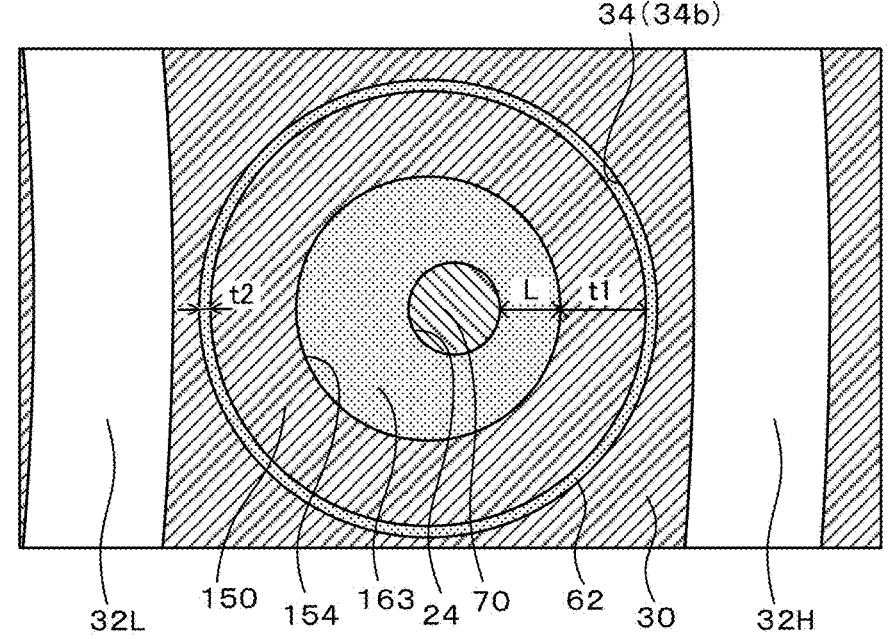
FIG. 10 is a C-C cross-sectional view (partially enlarged horizontal cross-sectional view) of FIG. 9.

FIG. 9 is a partially enlarged vertical cross-sectional view of a wafer placement table 110 which is a second embodiment, and FIG. 10 is a C-C cross-sectional view (partially enlarged horizontal cross-sectional view) of FIG. 9.

The wafer placement table 110 is the same as in the first embodiment except that the central axis of the base plate through-hole 34 is eccentric from the central axis of the ceramic plate bottomed hole 24, an insulating tube 150 is used instead of the insulating tube 50, and an insulating tube inner circumferential surface adhesive layer 163 is provided in the first embodiment. Thus, in FIGS. 9 and 10, the same components as in the first embodiment are labeled with the same symbol.

As illustrated in FIG. 10, the central axis of the base plate through-hole 34 is eccentric toward the center of the ceramic plate 20 with respect to the ceramic plate bottomed hole 24. The wall thickness t1 of the insulating tube 150 is constant in a circumferential direction of the insulating tube 150. Specifically, the center of the inner circumferential circle (insulating tube through-hole 154) of the insulating tube 150 is aligned with the center of the outer circumferential circle of the insulating tube 150. The central axis of the insulating tube 150 is aligned with the central axis of the base plate through-hole 34, but is eccentric from the central axes of the ceramic plate bottomed hole 24. The insulating tube inner circumferential surface adhesive layer 163 is provided not to cover the ceramic plate bottomed hole 24, but to bond the inner circumferential surface of the insulating tube 150 and the lower surface 23 of the ceramic plate 20 together. The insulating tube inner circumferential surface adhesive layer 163 is integral with the adhesive layer 60. The length L of the insulating tube inner circumferential surface adhesive layer 163 in a radial direction continuously varies in a circumferential direction of the insulating tube 150. The length L is the shortest at the position closest to the flow channel 32H, and gradually increases as the distance to the flow channel 32L decreases, then is the longest at the position closest to the flow channel 32L.

In the second embodiment, the length L of the insulating tube inner circumferential surface adhesive layer 163 in a radial direction continuously varies in a circumferential direction of the insulating tube 150. Thus, the thermal resistance from the central axis of the ceramic plate bottomed hole 24 to the inner circumferential surface 34b of the base plate through-hole 34 continuously varies in a circumferential direction of the insulating tube 150. Heat removal in the area where the thermal resistance is low is more favorable than the area where the thermal resistance is high. The length L of the insulating tube inner circumferential surface adhesive layer 163 in a radial direction is the shortest at the position closest to the flow channel 32H, and gradually increases as the distance to the flow channel 32L decreases, then is the longest at the position closest to the flow channel 32L. Therefore, as in the area immediately above the boundary portion, also in the area immediately above the holes of the wafer placement surface 21, the temperature gradually increases from the flow channel 32H to the flow channel 32L. Therefore, also in the second embodiment, the area immediately above the holes of the wafer placement surface 21 has a substantially similar temperature distribution to the temperature distribution of the area immediately above the boundary portion.

In the wafer placement table 110 of the second embodiment described in detail above, the length L of the insulating tube inner circumferential surface adhesive layer 163 in a radial direction continuously varies in a circumferential direction of the insulating tube 150, which is suitable for controlling and designing the degree of heat removal in part of the wafer placement surface 21 to be non-uniform, the part being immediately above the ceramic plate bottomed hole 24.

The wall thickness t1 of the insulating tube 150 is constant in a circumferential direction of the insulating tube 150, and the central axis of the insulating tube 150 is eccentric from the central axis of the ceramic plate bottomed hole 24. Thus, the length L of the insulating tube inner circumferential surface adhesive layer 163 in a radial direction can be continuously varied in a circumferential direction of the insulating tube 150 relatively easily.

Furthermore, the base plate through-hole 34 is provided between adjacent parts of refrigerant flow path 32 in the base plate 30, and one (the flow channel 32H) of the adjacent parts of refrigerant flow path 32 has a higher ceiling surface 32a than the other (the flow channel 32L). In this case, heat is more likely to be removed from the ceramic plate 20 by the flow channel 32H than by the flow channel 32L, thus the temperature of the wafer placement surface 21 gradually increases from a position opposed to the flow channel 32H to a position opposed to the flow channel 32L. Thus, it is preferable to design the degree of heat removal in part of the wafer placement surface 21 to correspond to this tendency, the part being immediately above the ceramic plate bottomed hole 24, thus the significance of application of the present invention is high.

Other Embodiments

Figure 11:
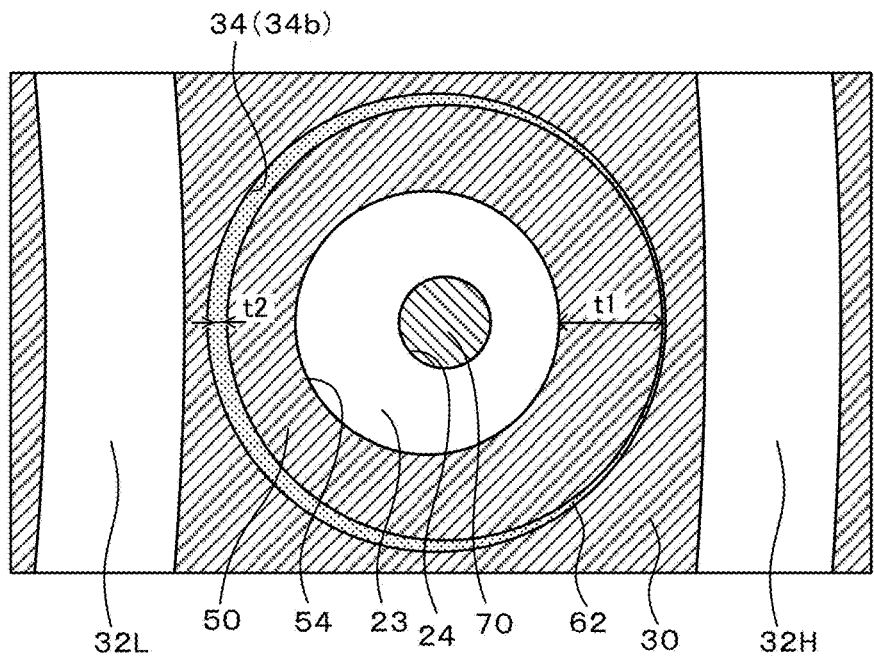
FIG. 11 is a partially enlarged horizontal cross-sectional view of another embodiment.

In the first embodiment described above, the wall thickness t2 (length in a radial direction) of the insulating tube outer circumferential surface adhesion part 62 is constant in a circumferential direction of the insulating tube 50; however, as illustrated in FIG. 11, the wall thickness t2 of the insulating tube outer circumferential surface adhesion part 62 may be continuously varied in a circumferential direction of the insulating tube 50. In FIG. 11, the wall thickness t2 of the insulating tube outer circumferential surface adhesion part 62 is the shortest at the position closest to the flow channel 32H, and gradually increases as the distance to the flow channel 32L decreases, then is the longest at the position closest to the flow channel 32L. The thermal resistance from the central axis of the ceramic plate bottomed hole 24 to the inner circumferential surface 34b of the base plate through-hole 34 continuously varies in a circumferential direction of the insulating tube 50 not only by the wall thickness t1 of the insulating tube 50, but also by the thickness t2 of the insulating tube outer circumferential surface adhesion part 62. In this case also, the area immediately above the holes of the wafer placement surface 21 has a substantially similar temperature distribution to the temperature distribution of the area immediately above the boundary portion.

Figure 12:
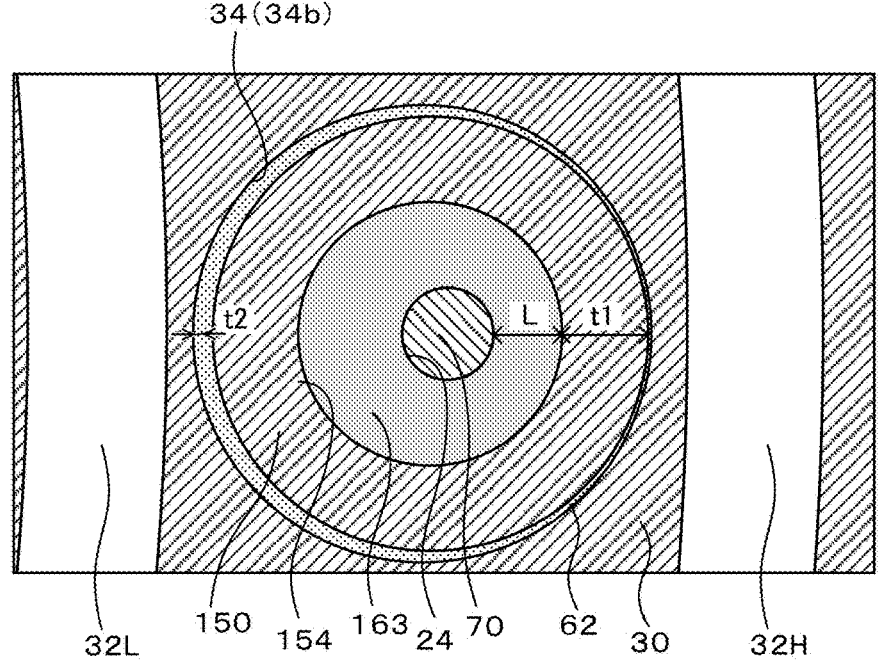
FIG. 12 is a partially enlarged horizontal cross-sectional view of another embodiment.

In the second embodiment described above, the wall thickness t2 (length in a radial direction) of the insulating tube outer circumferential surface adhesion part 62 is constant in a circumferential direction of the insulating tube 50; however, as illustrated in FIG. 12, the wall thickness t2 of the insulating tube outer circumferential surface adhesion part 62 may be continuously varied in a circumferential direction of the insulating tube 50. In FIG. 12, the wall thickness t2 of the insulating tube outer circumferential surface adhesion part 62 is the shortest at the position closest to the flow channel 32H, and gradually increases as the distance to the flow channel 32L decreases, then is the longest at the position closest to the flow channel 32L. The thermal resistance from the central axis of the ceramic plate bottomed hole 24 to the inner circumferential surface 34b of the base plate through-hole 34 continuously varies in a circumferential direction of the insulating tube 50 not only by the length L of the insulating tube inner circumferential surface adhesive layer 163 in a radial direction, but also by the thickness t2 of the insulating tube outer circumferential surface adhesion part 62. In this case also, the area immediately above the holes of the wafer placement surface 21 has a substantially similar temperature distribution to the temperature distribution of the area immediately above the boundary portion.

The above-described first embodiment and the embodiment in FIG. 11 may be further provided with the insulating tube inner circumferential surface adhesive layer 163 of the second embodiment. Even in this manner, the area immediately above the holes of the wafer placement surface 21 has a substantially similar temperature distribution to the temperature distribution of the area immediately above the boundary portion.

Figure 13:
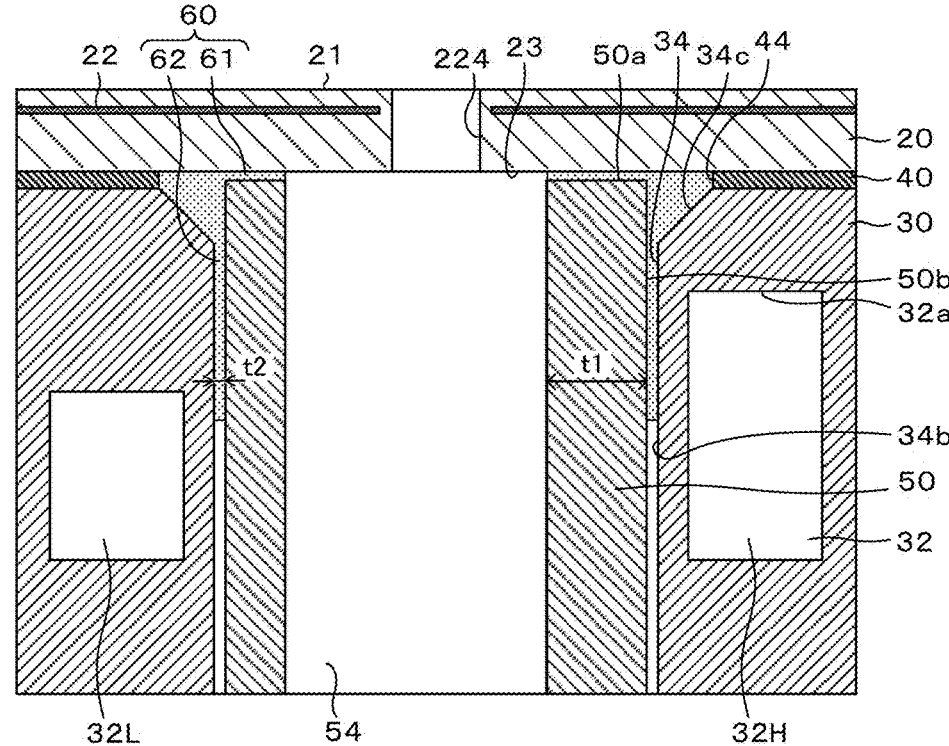
FIG. 13 is a partially enlarged vertical cross-sectional view of another embodiment.

In the above-described first embodiment, the ceramic plate bottomed hole 24 is used as the ceramic plate hole, and a structure has been provided in which the power supply member 70 inserted into the insulating tube through-hole 54 of the insulating tube 50 and the ceramic plate bottomed hole 24 is electrically connected to the electrostatic electrode 22; however, the ceramic plate hole is not limited to this particular structure. For example, as illustrated in FIG. 13, the ceramic plate hole may be a ceramic plate through-hole 224 that penetrates the ceramic plate 20 and the electrostatic electrode 22 in an up-down direction. The electrostatic electrode 22 is not exposed to the inner circumferential surface of the ceramic plate through-hole 224. In FIG. 13, the same components as in the first embodiment are labeled with the same symbol. The ceramic plate through-hole 224 like this can be utilized, for example, as a gas hole for supplying a heat transfer gas (e.g., He gas) to the lower surface of the wafer W, or as a lift pin hole for inserting a lift pin to vertically move the wafer W with respect to the wafer placement surface 21.

Figure 14:
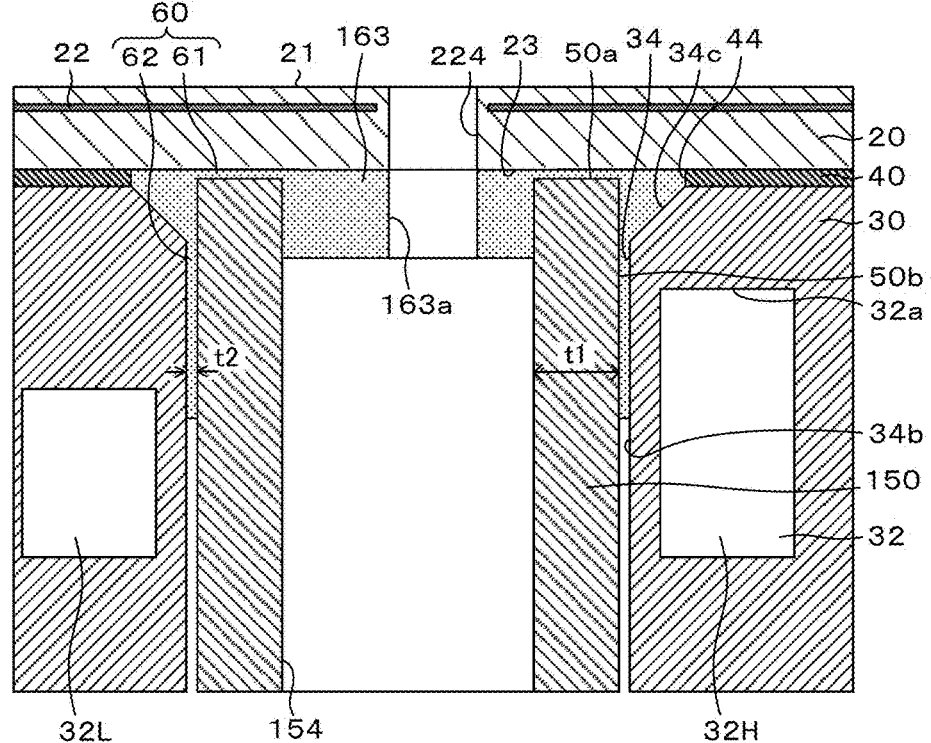
FIG. 14 is a partially enlarged vertical cross-sectional view of another embodiment.

This point also applies to the second embodiment (see FIG. 14). In FIG. 14, the insulating tube inner circumferential surface adhesive layer 163 is provided with an adhesive layer through-hole 163a at a position opposed to the ceramic plate through-hole 224, the adhesive layer through-hole 163a being coaxially with and having the same diameter as the ceramic plate through-hole 224. Thus, as in the second embodiment, the length L of the insulating tube inner circumferential surface adhesive layer 163 in a radial direction continuously varied in a circumferential direction of the insulating tube 50. In FIG. 14, the same components as in the second embodiment are labeled with the same symbol.

In the above-described first embodiment, a resin adhesive layer has been illustrated as the bonding layer 40, however, is not limited thereto. For example, a metal bonding layer may be used as the bonding layer 40. The metal bonding layer can be formed by well-known TCB (Thermal compression bonding) using a metal bonding material (e.g., Al—Mg based bonding material or Al—Si—Mg based bonding material). This point also applies to the second embodiment and other embodiments.

In the above-described first embodiment, the electrostatic electrode 22 is built in the ceramic plate 20, however, is not limited thereto. For example, in substitution for or in addition to the electrostatic electrode 22, a heater electrode (resistance heating element) may be built in or a plasma generating electrode (RF electrode) may be built in. This point also applies to the second embodiment and other embodiments.

Note that the present invention is not limited in any way to the embodiment above, and it goes without saying that the present invention can be carried out in various modes as long as the modes pertain to the technical scope of the present invention.

International Application No. PCT/JP2023/038375, filed on Oct. 24, 2023, is incorporated herein by reference in its entirety.

What is claimed is:

1. A member for semiconductor manufacturing apparatus, comprising:

a ceramic plate having a wafer placement surface on an upper surface and a built-in electrode;

a base plate provided on a lower surface of the ceramic plate, and configured to include a built-in refrigerant flow path;

a base plate through-hole provided between adjacent parts of the refrigerant flow path, and configured to penetrate the base plate in an up-down direction;

an insulating tube provided in the base plate through-hole, and fixed; and a ceramic plate hole open to the lower surface of the ceramic plate, and provided to communicate with an inside of the insulating tube, wherein a wall thickness of the insulating tube continuously varies in a circumferential direction of the insulating tube.

2. The member for semiconductor manufacturing apparatus according to claim 1, wherein a center of an inner circumferential circle of the insulating tube is eccentric from a center of an outer circumferential circle of the insulating tube.

3. The member for semiconductor manufacturing apparatus according to claim 1, wherein an outer circumferential surface of the insulating tube is bonded via an insulating tube outer circumferential surface adhesive layer to an inner circumferential surface of the base plate through-hole, and a thickness of the insulating tube outer circumferential surface adhesive layer varies in a circumferential direction of the insulating tube.

4. The member for semiconductor manufacturing apparatus according to claim 1, wherein the base plate through-hole is provided between adjacent parts of the refrigerant flow path, and one of the adjacent parts of the refrigerant flow path has a higher ceiling surface than the other refrigerant flow path.

5. The member for semiconductor manufacturing apparatus according to claim 1, wherein the ceramic plate hole is a bottomed hole provided from the lower surface of the ceramic plate to the electrode, or a through-hole penetrating the ceramic plate in an up-down direction.

* * * * *